United States Patent [19]
Green

[11] Patent Number: 4,665,466
[45] Date of Patent: May 12, 1987

[54] LOW HEADROOM VENTILATING APPARATUS FOR COOLING AN ELECTRICAL ENCLOSURE

[75] Inventor: Peter J. Green, Huntington, W. Va.

[73] Assignee: Service Machine Company, Huntington, W. Va.

[21] Appl. No.: 802,041

[22] Filed: Nov. 26, 1985

Related U.S. Application Data

[63] Continuation-in-part of Ser. No. 532,701, Sep. 16, 1983, abandoned.

[51] Int. Cl.⁴ .............................................. H05K 7/20
[52] U.S. Cl. ................................. 361/384; 174/16 R; 361/385
[58] Field of Search ............. 98/1, 115.3; 174/16 R; 312/100, 213, 236; 336/59; 361/383, 384, 385

[56] References Cited

U.S. PATENT DOCUMENTS

| | | | |
|---|---|---|---|
| 2,340,727 | 2/1944 | Zely | 174/16 R X |
| 2,459,322 | 1/1949 | Johnston | 336/59 X |
| 2,516,184 | 7/1950 | Christie | 361/384 |
| 2,774,808 | 12/1956 | Bullock | 312/213 X |
| 2,824,939 | 2/1958 | Claybourn et al. | 361/384 X |
| 2,843,806 | 7/1958 | O'Neill | 174/16 R X |
| 2,882,478 | 4/1959 | Hobart et al. | 174/16 R X |
| 3,157,730 | 11/1964 | Willox | 312/236 X |
| 3,210,456 | 10/1965 | Skubal | 336/59 X |
| 3,317,798 | 5/1967 | Chu et al. | 361/384 |
| 4,359,085 | 11/1982 | Mueller | 361/384 X |

FOREIGN PATENT DOCUMENTS 2341972 9/1977 France .................................. 336/59

OTHER PUBLICATIONS

Chu et al., "Air Cooling Scheme", *IBM Technical Disclosure Bulletin*, vol. 16, No. 1, Jun. 1973, pp. 296 and 297.

*Primary Examiner*—Harold Joyce
*Attorney, Agent, or Firm*—McCaleb, Lucas & Brugman

[57] ABSTRACT

Apparatus for cooling an electrical enclosure for use where headroom is limited. An imperforate top wall and a perforate ceiling wall below it define an exhaust compartment. The ceiling wall has openings above natural hot spots on heat-producing electrical components in the enclosure to receive heated air rising by convection. In one embodiment, louvered intake openings and internal baffles direct cool, external air to the bottom of the head-producing components. A fan draws heated air from the exhaust compartment and discharges it through a louvered orifice outside the enclosure, thereby augmenting the natural upflow of heated air by convection and preventing accumulation of heated air. In another embodiment, especially suited to dusty or corrosive environments, the electrical components are completely sealed, and clean inside cooling air is continuously recycled in a closed circuit between the heat-producing components and refrigerant-cooled heat-exchange apparatus. In both embodiments, the air-circulating fans and associated ductwork are supported in the housing independently of the top cover wall enabling the latter to be removed without disturbing a fan or power connection to it.

4 Claims, 8 Drawing Figures

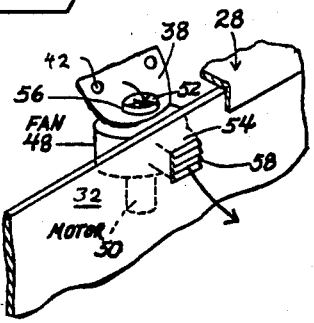
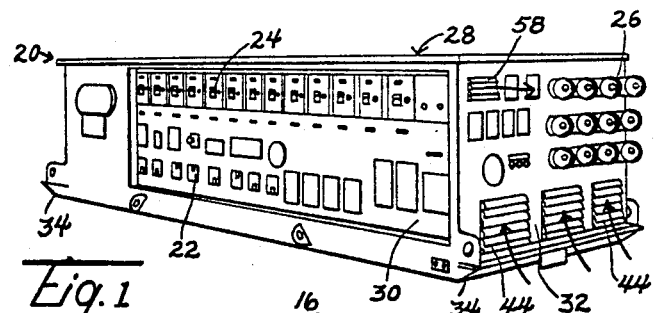
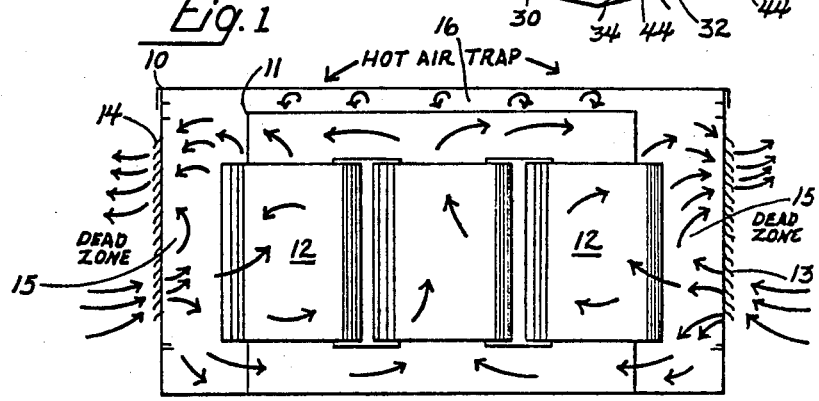
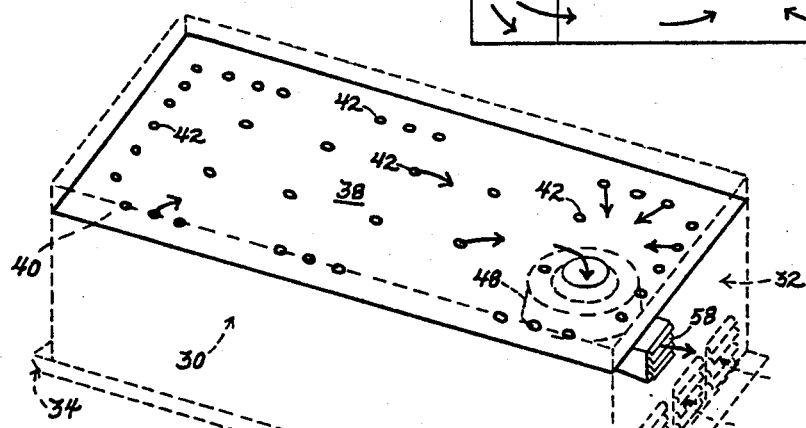
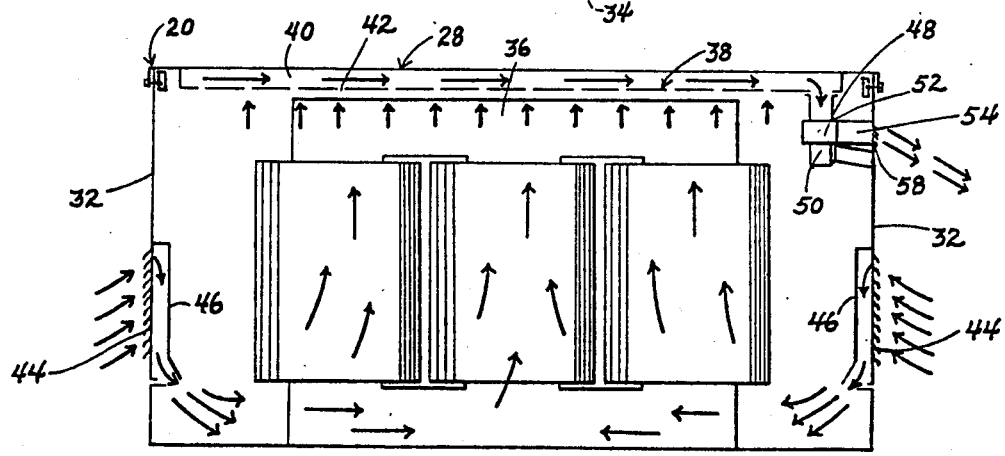

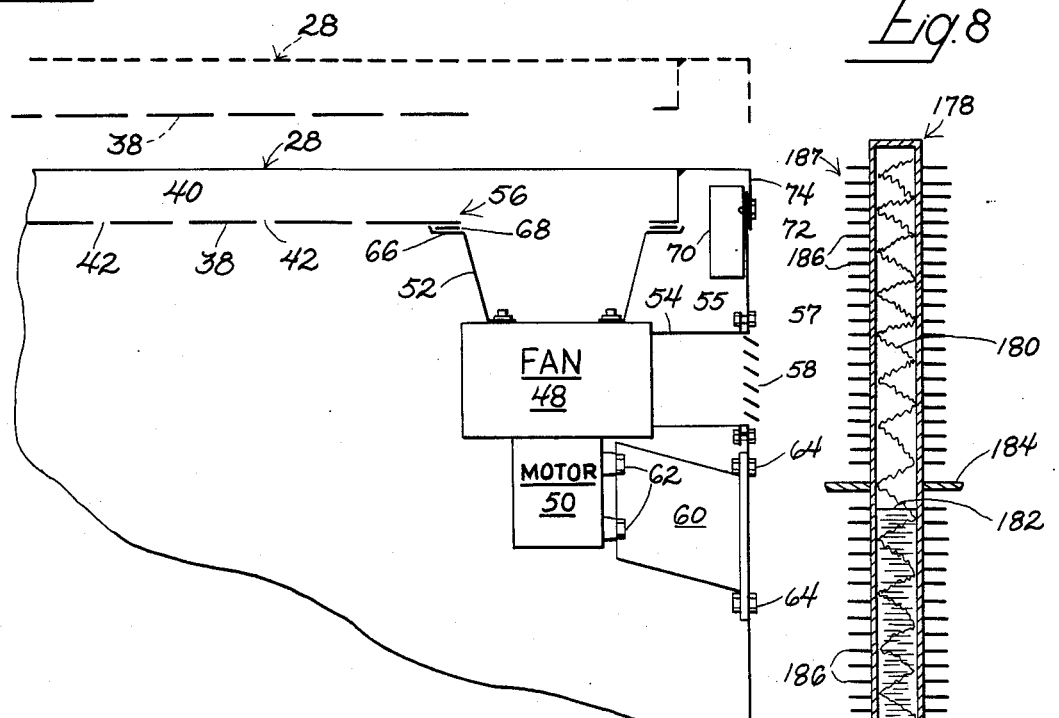
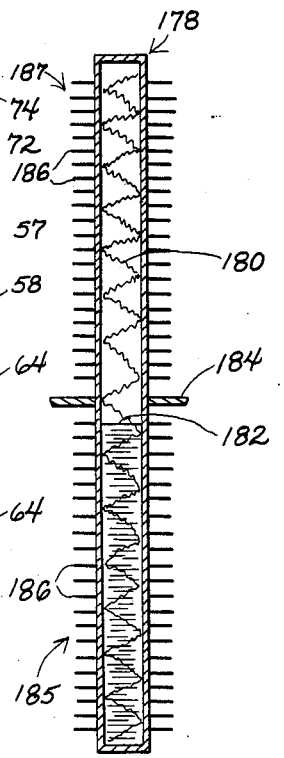
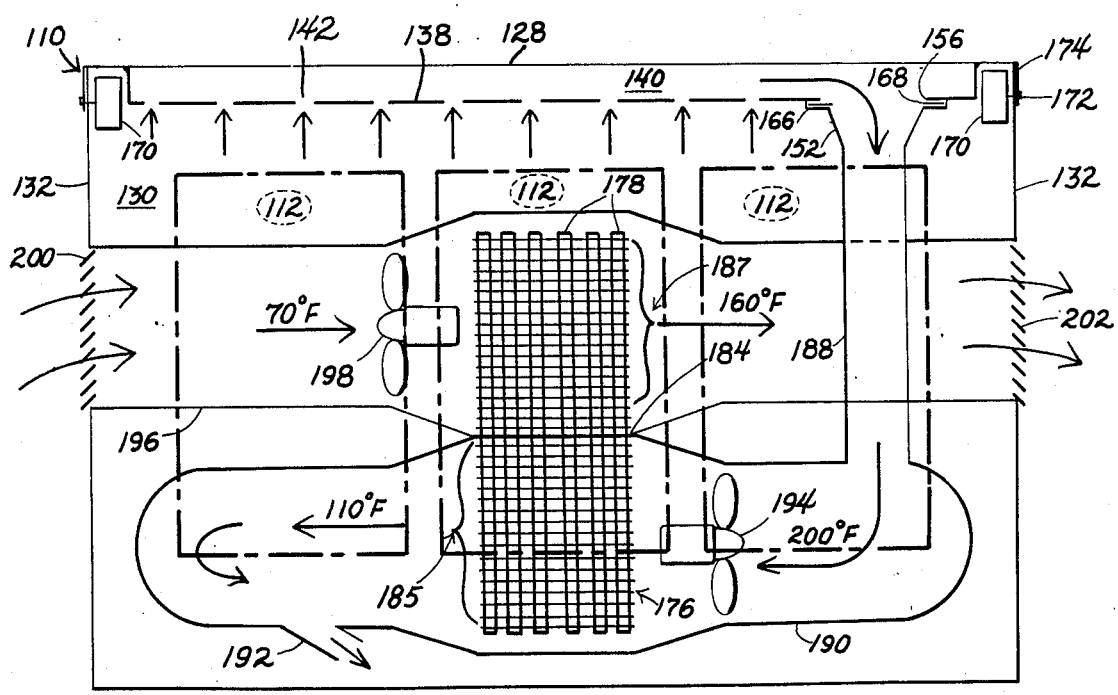

LOW HEADROOM VENTILATING APPARATUS FOR COOLING AN ELECTRICAL ENCLOSURE

This is a continuation-in part of Ser. No. 532,701 filed Sept. 16, 1983 now abandoned.

BACKGROUND OF THE INVENTION

The invention relates generally to electrical enclosures such as battery chargers, power centers, rectifiers and transformers used in dusty, low headroom environments such as in underground mines. In particular, it relates to improved ventilating and cooling apparatus for same.

A "power center" used in underground coal mines is one example of an electrical enclosure where the present invention is useful. It has an elongated housing often mounted on skids for movement about an underground coal mine. It receives electrical energy at high voltage, up to 15,000 volts and has a number of transformers and other internal components which produce lower voltage outputs. For example, it may have alternating current input at 15,000 volts and outputs at various lower voltages in direct and alternating current configurations. There may be one or more output circuits providing, say, 1500 volts for a continuous miner, 220 or 420 volts for conveyor drive motors, and 110 volts AC or DC for underground lighting circuits.

These are principally mobile transformer stations including one or more power transformers and associated high low voltage circuit breakers together with various protective devices and instrumentation.

Power centers for longwall mining systems tend to increase in capacity from year to year. A typical, modern power center may have over 2,000,000 watts of transformer capacity producing up to 30,000 watts of heat loss which must be dissipated from the enclosure. Attempts to dissipate heat of this magnitude by simple convection and radiation devices are unsatisfactory and result in the internal components becoming overheated.

The problem is exacerbated by the overall shape of typical power centers used in United States coal mining practice where mine entries and rooms are little higher than the thickness of the coal seam and the top wall is often so close to the roof that no effective internal or external convection cooling up drafts can be developed. Dimensions of a typical longwall power center may be 20 feet long, 6 feet wide, and 3 feet high.

Transformers used in these low-height enclosures are often of a special design to suit the height restriction, but even so, the top of the transformer core comes to within 2 to 3 inches of the top wall. The top wall itself must be imperforate, having no ventilation holes through which dust and roof debris can enter the enclosure.

Another problem exacerbating cooling of the internal components by convection air currents, in addition to the above-mentioned proximity of the top wall to the roof, is the great number of switches, meters, and electrical connectors commonly provided in the side walls leaving little room for ventilation louvers.

As a result of the circumstances described above, convection is no longer effective to dissipate the heat developed in modern high-capacity electrical enclosures. A stagnant layer of very hot air accumulates inside the enclosure just below the top wall. Without ventilation augmentation provided by the present invention, this can shorten the life of the electrical components, causing them to fail prematurely.

SUMMARY OF THE INVENTION

It is a general object of the present invention to provide an electrical enclosure, for use in a limited headroom environment, with ventilating and cooling apparatus employing fan cooling to augment normal convection cooling.

Another object is to provide such ventilating and cooling apparatus using a minimum of scarce headroom.

Another object is to provide an electrical enclosure with ventilating and cooling apparatus having a perforate ceiling wall spaced a short distance below a top cover wall overlying the heat-producing components, the two walls defining an exhaust compartment therebetween having insignificant headroom requirement and connected to an exhaust fan, either discharging directly through one of the side walls, or to an internal heat transfer unit in a closed recycle system.

Another object is to provide such apparatus in which openings through the ceiling wall are arranged in vertical alignment with the natural hot spots on the heat-producing components whereby the apparatus is well-suited to customizing for maximum efficiency by varying the location of openings in the ceiling wall.

Another object is to provide such an electrical enclosure especially suited for dusty environments in which the internal compartment containing the electrical components is completely sealed, and clean cooling air is continuously recycled in a closed circuit between the heat-producing components and refrigerant-cooled heat exchanger apparatus.

Another object is to provide a continuous supply of cooling air to heat-producing electrical components by means of refrigerant-containing heat tubes which require no internal power source.

One advantage of applying this invention to electrical enclosures is that only minimal size ambient air intake and discharge louvers are needed and these can readily be located in any available side wall area not used for switches, meters and connectors. The manufacturing costs of the invention are low and little custom engineering is required.

BRIEF DESCRIPTION OF THE DRAWINGS

Other objects and advantages will be apparent from the following description taken in connection with the accompanying drawings in which:

FIG. 1 is an external perspective view of a power center used in underground coal mines illustrating one embodiment of the present invention using ambient air for directly cooling the internal heat-producing components;

FIG. 2 is a vertical longitudinal sectional view of FIG. 1 showing in schematic form the flow of cooling air through the power center;

FIG. 3 is a further perspective view of the power center with the external outline of the housing shown in broken lines and the perforate ceiling below the top wall shown in solid lines to illustrate one pattern of openings above the heat-producing components;

FIG. 4 is a fragmentary view of FIG. 3;

FIG. 5 is a view similar to FIG. 2 showing a typical air flow pattern in a conventional electrical enclosure made for low headroom applications and relying solely on internal convection and intake and discharge louvers for cooling;

FIG. 6 is a fragmentary, enlarged view of FIG. 2;

FIG. 7 is a view similar to FIG. 2 of an alternate embodiment; and

FIG. 8 is a fragmentary enlarged view of one of the heat tubes in the heat transfer unit shown in FIG. 7.

Like parts are referred to by like reference characters.

DESCRIPTION OF THE PREFERRED EMBODIMENT

Before describing the present invention in detail, a conventional electrical enclosure shown in FIG. 5 comprises a housing 10 with one or more internal components such as a multi-core transformer 11 having a plurality of coils 12. The transformer generates waste heat which is removed by air convection currents moving unwardly along the transformer, drawing air in through input louvers 13 and out through output louvers 14. For a high capacity electrical enclosure with which the present invention is concerned, cooling of the internal components is non-uniform and unsatisfactory. There are dead zones 15 along the sides of the transformer coils 12, between the input and output louvers, which are not effectively cooled, and hot air is trapped in the upper part 16 of the housing just beneath the top wall.

Referring now to the specific embodiment of the invention shown in FIGS. 1-4, the particular electrical enclosure chosen to illustrate the invention is a power center generally designated 20. As shown in FIG. 1, some of these enclosures, while substantial in size, may have their side walls substantially covered with switches 22, meters 24 and input and output connectors 26, leaving relatively little side wall area available for ventilating louvers.

The enclosure comprises a rectangular housing having a top cover wall 28, side walls 30 and 32, and a bottom mounted on skids 34 enabling it to be moved from one location to another in an underground mine. The height of the enclosure is determined by the minumum height of the roadways, rooms and entries through which it is moved.

As shown in FIG. 2, a transformer 36 is illustrated as one example of a heat-producing electrical component which is ventilated and cooled by the present invention.

The top wall 28 is imperforate, being completely closed to prevent dust and pieces of rock and coal from migrating or falling into the housing. A short distance below the top wall, from one to four inches in a typical example, a perforate ceiling wall 38 is provided. This is attached as by welding and is parallel to the top wall and generally co-extensive therewith and defines an exhaust compartment 40 with insignificant headroom requirements extending completely over the transformer 36. The ceiling wall has openings 42 in vertical alignment with natural hot spots on the transformer. A particular installation can be "customized" for maximum ventilation and cooling by tailoring the pattern of holes 42 to accommodate the specific heat-producing components and their arrangement within the housing.

Air intake means is provided at opposite ends of the bottom of the housing. These comprise intake louvers 44 in opposite side walls 32. Within each, a baffle 46 directs cool intake air to the base of the transformer and spreads it along the bottom to promote uniform cooling.

As best shown in FIG. 6, fan 48 operated by a motor 50 has an inlet duct 52 registered with an exhaust opening 56 in the ceiling wall 38, and an exit duct 54 registered with a discharge louver 58 in one of the side walls 32. The exit duct has a flanged outlet end 55 connected to the side wall by bolts 57. The motor is fastened to a bracket 60 by bolts 62 and the bracket is fastened to the side wall by bolts 64. The inlet duct has a flange 66 at its upper end with a foam rubber gasket 68 providing an effective seal against the underside of the perforate ceiling wall 38.

The upper edge of the housing 10 has a rectangular tube 70 fastened as by welding, completely around the periphery serving as a structural reinforcement and providing a solid base for screws 72 which extend through the skirt 74 on the top cover wall 28 to hold it in place.

The above-described structure mounts the motor, fan and intake and exhaust conduits in a free-standing manner to the side wall independently of the top cover wall 28 and perforate ceiling wall 38 enabling the latter two to be removed as a unit for cleaning, inspection or maintenance simply by removing screws 72 and lifting it off the foam rubber gasket 68 as shown in broken lines in FIG. 6.

Use and operation of the embodiment shown in FIGS. 1-4 is believed to be clear from the above. Briefly, heated air rises from the sides and top of the transformer, and passes unwardly through openings 42 into the exhaust compartment 40. Cool, fresh, ambient make-up air is drawn in through intake louvers 44. The heated air is continuously exhausted from compartment 40 by the fan 48 through the discharge louver 58 before it can accumulate and overheat the transformer.

The embodiment shown in FIG. 7 and 8 is specially suited for low headroom dusty environments because the internal compartment containing the electrical components is completely sealed, and clean air is continuously recycled in a closed circuit between the heat producing components and refrigerant-cooled heat exchanger apparatuses.

FIG. 7 is a schematic representation showing a longitudinal cross-section through a housing 110 with internal, electrical heat-generating components such as a plurality of transformer coils 112 shown in broken lines. In a different cross-section, shown in solid lines, is the internal cooling apparatus which will now be described.

The housing has side walls 130 (only one of which is shown) and 132, 132 with a rectangular cross-section reinforcement 170 welded completely around the inner, upper periphery of the side walls.

The top cover wall 128 is imperforate to keep dust and pieces of rock and coal from falling into the housing. A short distance below, a perforate ceiling wall 138 is welded to the top wall and is removable as a unit therewith. An exhaust compartment 140 is defined between walls 128 and 138. The top wall 128 has a skirt 174 fastened as by screws 172 to the side walls and reinforcing tube 170. The top cover wall 128 and inner perforate wall 138 may be removed for inspection, maintenance or cleaning as described above for top cover wall 28, after removing screws 172.

A heat transfer unit generally designated 176 comprises a plurality of vertical heat pipes 178 each being closed at both ends. One is shown in FIG. 8. Each heat pipe 178 includes internal wicklike means of any suitable kind which is schematically indicated at 180 extending between the evaporator and condenser sections 185 and 187 respectively. The wick means may comprise spiraled capillary grooves (not shown) on the inside surface of the pipe wall as described in U.S. Pat. No. 3,753,364 issued Aug. 21, 1973 to James E. Runyan and George M. Grover. Each heat pipe is evacuated, partly filled with a refrigerant 182 such as 1,2-dichloro-1,1,2,2-tetrafluoro ethane ($CClF_2CClF_2$) known in the trade as "R-114", and permanently sealed. The heat pipes themselves may be conventional and are not new, so will not be described in detail. For additional information about heat pipes, reference may be had to U.S. Pat. Nos. 3,788,388, 3,865,184, 4,020,898, 4,426,959, 4,440,215, and 4,441,544.

The heat pipes 178 extend through a partition 184. The end portions below the partition comprise the (heat absorbing) evaporator section 185 of the heat transfer unit, and the end portions above the partition comprise the (heat emitting) condenser section 187. Parallel plates or fins 186 tie the heat tubes together into a single structural unit, and augment the heat absorbing and heat emitting functions of the respective heat tube end portions.

For maximum heat transfer efficiency, the air flow in the evaporator and condenser sections 185 and 187 is countercurrent as shown in FIG. 7.

Thermal energy applied to the evaporator ends of the heat pipes 178 causes the liquid refrigerant to vaporize and absorb heat from the hot surrounding air through the pipe walls equivalent to the latent heat of vaporization. The refrigerant vapor rises to the other ends of the pipes which are cooled below the condensation temperature by fan 198. The vapor condenses into liquid again giving up its latent heat of condensation which flows through the pipe walls and is carried away by the ambient, cooling air stream. The condensed liquid then flows back by gravity to the evaporator section (i.e., the hot side) to be reused, thus completing the refrigerent liquid/vapor/liquid cycle.

A first conduit means includes a vertical duct 188 and a horizontal duct 190 with a motor driven fan 194 which moves hot air from the upper compartment 140 through the heat exchanger evaporator, section 185 to an exit nozzle 192 into the bottom of the housing and thence upwardly across the cooling coils 112 through ceiling wall openings 142 back to the compartment 140.

The inlet end of the vertical duct 188 is flared and has a flanged connection similar to that of the other embodiment shown in FIG. 6. There is an external flange 166 at its upper end with a foam rubber gasket 168 providing a seal against the underside of the perforate ceiling wall 138.

Thus, it will be seen the same clean cooling air moving across transformer coils is in a closed cycle. The coils and evaporator section 185 are never exposed to outside air so they stay clean and dry no matter how dusty or humid, or contaminated the outside air may be.

A second conduit means includes a horizontal duct 196 with a motor driven fan 198 which moves ambient air between lowered inlet and outlet ports 200 and 202 respectively through the heat exchanger condenser section 187.

Dust accumulation in the duct 196 is minimized by the louvers in the openings 200 and 202. Even in the most dusty atmosphere, accumulation of dust in the condenser section 187 will be slow and is readily blown off by an air hose directed through one of the openings as an infrequent maintenance operation.

Use and operation of the embodiment shown in FIGS. 6-8 is believed to be clear from the above description. Briefly, treated air rising from the transformer coils 112, passes upwardly through openings 142 into the exhaust compartment 140. For safety and long equipment life, the first motor driven fan 194 and the heat transfer unit 176 will be sized to prevent overheating. Typically, the heated air in compartment 140 may be about 200° F., and drops to 110° F. in passing through the evaporator section 185. It exits form nozzle 192 into the bottom of the housing.

Typically, ambient air temperature drawn into duct 196 by the second motor driven fan 198 may be in the neighborhood of 70° F. and rise to about 160° F. in passing through the condenser section 187.

With respect to the embodiment shown in FIG. 7, it should be understood that this invention is not limited to heat tubes which are vertically disposed as shown. Alternatively, they may be disposed horizontally, or at an angle as required for the most efficient operation.

A feature of the invention is that the air circulating fans and their associated ductwork are supported in the housing independently of the top cover wall, enabling the top and ceiling walls to be removed as a unit for cleaning, inspection or maintenance without disturbing any fan or any power connection to a fan motor. That structure has already been described in connection with FIG. 6. Referring to the comparable structure in FIG. 7, both the fans 194 and 198 and their associated ductwork are supported in the housing independently of the top cover wall 128 and ceiling wall 138. The inlet duct 152 is mounted in a free-standing manner and the top cover wall 128 and ceiling wall 138 can be lifted off to a broken line position similar to that shown in FIG. 6 after removing screws 172.

An important feature of the invention as described is that the fan 48 (or 194) maintains the exhaust compartment 40 (or 140) under less than atmospheric pressure at all times, minimizing the accumulation of dust within that compartment and minimizing the possibility of a dust explosion triggered by sparking or localized overheating of the internal components.

The embodiments described and shown to illustrate the present invention have been necessarily specific for purposes of illustration. Alterations, extensions and modifications would be apparent to those skilled in the art.

The embodiments of the invention in which an exclusive property or privilege is claimed are defined as follows:

1. In an electrical enclosure for use in limited headroom conditions such as in underground mines, a housing having an imperforate top cover wall, side walls, and heat-producing components therein, means for cooling and ventilating the housing comprising:

a perforate ceiling wall carried by the top cover wall and removable therewith as a unit from the housing, said ceiling wall being spaced a shrot distance below and substantially parallel to the top cover wall and defining an exhaust compartment requiring insignificant headroom and extending completely over the heat-producing components in position to receive heated air rising therefrom;
   said ceiling wall having a discharge opening therein;
   means for continuously removing heated air from the exhaust compartment including duct means aligned with the underside of said discharge opening and a fan and drive motor therefor connected to draw air from said exhaust compartment through said duct means; and said fan and drive motor therefor being fastened in a free-standing manner to the housing independently of the top cover wall and perforate ceiling wall enabling them to be removed as a unit for cleaning, inspection and maintenance without moving the fan or disturbing any power connections to the motor.

2. In an electrical enclosure, the combination of claim 1 having:
air intake means in the bottom portion of the housing and means for directing incoming ambient air against the lower portion of the heat-producing components and upwardly along the sides thereof into said exhaust compartment; and
the discharge side of the fan connected to an air discharge opening in one of the side walls to maintain the pressure in the exhaust compartment below the external ambient pressure to maximize the air flow and minimize the accumulation of dust within the exhaust compartment.

3. In an electrical enclosure, the combination of claim 1 in which:
said housing has a heat transfer unit therein comprising a plurality of upstanding, refrigerant-containing heat tubes with a heat absorbing evaporating section and a heat emitting condensing section; and
duct means on the discharge side of the fan discharging heated air through said evaporating section onto the lower portion of the heat-producing components and thence in a close cycle back through the exhaust compartment.

4. In an electrical enclosure, the combination of claim 3 in which:
additional duct means an additional fan and drive motor therefor is provided in the housing with inlet and outlet ports for moving a stream of ambient cooling air through the condensing section of said heat transfer unit.

* * * * *

UNITED STATES PATENT AND TRADEMARK OFFICE
CERTIFICATE OF CORRECTION

PATENT NO. : 4,665,466
DATED : May 12, 1987
INVENTOR(S) : PETER GREEN

It is certified that error appears in the above—identified patent and that said Letters Patent is hereby corrected as shown below:

IN THE SPECIFICATION:

Column 3, line 68; "opent-" should be -- open- --.

Column 4, line 39; "apparaturs" should be -- apparatus --.

Column 6, line 7; "form" should be -- from --.

IN THE CLAIMS:

Claim 1, column 6, line 56; "shrot" should be -- short --.

Claim 3, column 8, line 12; "close cycle" should be -- closed cycle --.

Signed and Sealed this

Third Day of November, 1987

Attest:

DONALD J. QUIGG

Attesting Officer

Commissioner of Patents and Trademarks